US010886278B2

(12) United States Patent
Wang et al.

(10) Patent No.: US 10,886,278 B2
(45) Date of Patent: Jan. 5, 2021

(54) METHOD OF FORMING AN ARRAY OF CAPACITORS, A METHOD OF FORMING DRAM CIRCUITRY, AND A METHOD OF FORMING AN ELEVATIONALLY-ELONGATED CONDUCTIVE STRUCTURE OF INTEGRATED CIRCUITRY

(71) Applicant: Micron Technology, Inc., Boise, ID (US)

(72) Inventors: Kuo-Chen Wang, Hiroshima (JP); Sanh D. Tang, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/578,608

(22) Filed: Sep. 23, 2019

(65) Prior Publication Data
US 2020/0020694 A1 Jan. 16, 2020

Related U.S. Application Data

(63) Continuation of application No. 16/021,709, filed on Jun. 28, 2018, now Pat. No. 10,475,796.

(51) Int. Cl.
*H01L 21/20* (2006.01)
*H01L 27/108* (2006.01)
(Continued)

(52) U.S. Cl.
CPC .... *H01L 27/10852* (2013.01); *H01L 21/7684* (2013.01); *H01L 21/76802* (2013.01);
(Continued)

(58) Field of Classification Search
CPC ........... H01L 27/10852; H01L 21/7684; H01L 27/10814; H01L 27/10885;
(Continued)

(56) References Cited

U.S. PATENT DOCUMENTS 5,935,868 A * 8/1999 Fang ................. H01L 21/76802
216/18
6,180,534 B1 * 1/2001 Shields ............. H01L 21/76814
438/725
(Continued)

OTHER PUBLICATIONS

U.S. Appl. No. 18/021,683, filed Jun. 28, 2018, by Tang et al.

*Primary Examiner* — Ismail A Muse
(74) *Attorney, Agent, or Firm* — Wells St. John P.S.

(57) ABSTRACT

A method of forming elevationally-elongated conductive structures of integrated circuitry comprises providing a substrate comprising a plurality of spaced elevationally-extending conductive vias individually having an upper horizontal perimeter. The conductive vias individually have an upper horizontal perimeter. Masking material is formed directly above the conductive vias. An opening is formed in the masking material directly above individual of the upper horizontal perimeters of individual of the conductive vias. Individual of the masking-material openings comprise a lower horizontal perimeter that overlaps the upper horizontal perimeter of the conductive via directly there-below. Individual of the masking-material openings comprise a lower horizontal perimeter that overlaps the upper horizontal perimeter of the conductive via directly there-below. Conductive material is formed in the individual masking-material openings against sidewalls of the individual masking-material openings and directly against the conductive via directly there-below. An upper horizontal perimeter of the conductive material in the individual masking-material openings extends outwardly beyond the upper horizontal perimeter of the conductive via directly there-below.

15 Claims, 17 Drawing Sheets

(51) Int. Cl.
*H01L 23/522* (2006.01)
*H01L 23/528* (2006.01)
*H01L 21/768* (2006.01)
*H01L 49/02* (2006.01)
*H01L 23/532* (2006.01)
*H01L 29/423* (2006.01)
*H01L 29/08* (2006.01)

(52) U.S. Cl.
CPC .... *H01L 21/76877* (2013.01); *H01L 23/5226* (2013.01); *H01L 23/5283* (2013.01); *H01L 23/53271* (2013.01); *H01L 27/10814* (2013.01); *H01L 27/10823* (2013.01); *H01L 27/10885* (2013.01); *H01L 28/60* (2013.01); *H01L 29/0847* (2013.01); *H01L 29/4236* (2013.01)

(58) Field of Classification Search
CPC ......... H01L 27/10823; H01L 23/53271; H01L 28/60; H01L 21/76877; H01L 21/76802; H01L 23/5283; H01L 23/5226; H01L 29/0847; H01L 29/4236
See application file for complete search history.

(56) References Cited

U.S. PATENT DOCUMENTS

| | | | | |
|---|---|---|---|---|
| 6,278,187 B1* | 8/2001 | Takata | | H01L 21/76819 257/758 |
| 6,313,029 B1* | 11/2001 | Kim | | H01L 21/76802 257/E21.577 |
| 6,448,651 B1* | 9/2002 | Kim | | H01L 21/76838 257/503 |
| 6,727,170 B2* | 4/2004 | Takata | | H01L 21/76819 257/758 |
| 7,192,858 B2* | 3/2007 | Abe | | H01L 21/76802 257/E21.536 |
| 7,241,676 B2* | 7/2007 | Watanabe | | H01L 21/76802 257/E21.579 |
| 7,317,253 B2* | 1/2008 | Nogami | | H01L 21/76808 257/758 |
| 9,754,886 B2* | 9/2017 | Boyanov | | H01L 23/5329 |
| 10,510,952 B2* | 12/2019 | Sung | | H01L 45/1675 |
| 2003/0129825 A1* | 7/2003 | Yoon | | H01L 21/76834 438/626 |
| 2004/0188842 A1* | 9/2004 | Takewaka | | H01L 23/5226 257/758 |
| 2006/0012052 A1 | 1/2006 | McDevitt et al. | | |
| 2007/0052101 A1* | 3/2007 | Usami | | H01L 23/5222 257/758 |
| 2007/0290248 A1 | 12/2007 | Weis | | |
| 2010/0197135 A1* | 8/2010 | Ishizaka | | H01L 21/28556 438/653 |
| 2010/0301491 A1* | 12/2010 | Yang | | H01L 21/76831 257/773 |
| 2012/0135579 A1 | 5/2012 | Park et al. | | |
| 2015/0287682 A1* | 10/2015 | Ahn | | H01L 23/53295 257/773 |
| 2015/0364414 A1 | 12/2015 | Tang et al. | | |
| 2016/0372422 A1* | 12/2016 | Lin | | H01L 23/53238 |
| 2017/0117218 A1 | 4/2017 | Liu | | |
| 2017/0186655 A1* | 6/2017 | Chen | | H01L 23/481 |
| 2018/0061840 A1 | 3/2018 | Sills | | |
| 2018/0197771 A1 | 7/2018 | Chang et al. | | |
| 2018/0197864 A1 | 7/2018 | Sills | | |
| 2018/0211911 A1 | 7/2018 | Wu et al. | | |
| 2019/0115299 A1* | 4/2019 | Hsieh | | H01L 23/49816 |
| 2019/0148288 A1* | 5/2019 | Tsou | | H01L 25/50 |
| 2019/0198506 A1 | 6/2019 | Kim et al. | | |
| 2019/0237660 A1* | 8/2019 | Lin | | H01L 43/08 |

* cited by examiner

US 10,886,278 B2

1

METHOD OF FORMING AN ARRAY OF CAPACITORS, A METHOD OF FORMING DRAM CIRCUITRY, AND A METHOD OF FORMING AN ELEVATIONALLY-ELONGATED CONDUCTIVE STRUCTURE OF INTEGRATED CIRCUITRY

RELATED PATENT DATA

This patent resulted from a continuation application of U.S. patent application Ser. No. 16/021,709, filed Jun. 28, 2018, entitled "A Method Of Forming An Array Of Capacitors, A Method Of Forming DRAM Circuitry, And A Method Of Forming An Elevationally-Elongated Conductive Structure Of Integrated Circuitry", naming Kuo-Chen Wang and Sanh D. Tang as inventors, the disclosure of which is incorporated by reference.

TECHNICAL FIELD

Embodiments disclosed herein pertain to methods of forming an array of capacitors, to methods of forming DRAM circuitry, and to methods of forming an elevationally-elongated conductive structure of integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

In some memory and other circuitry, a capacitor connects to a source/drain region of a field effect transistor therebelow through an elevationally-elongated conductive structure such as a conductive via.

DETAILED DESCRIPTION OF EXAMPLE EMBODIMENTS

Figure 1:
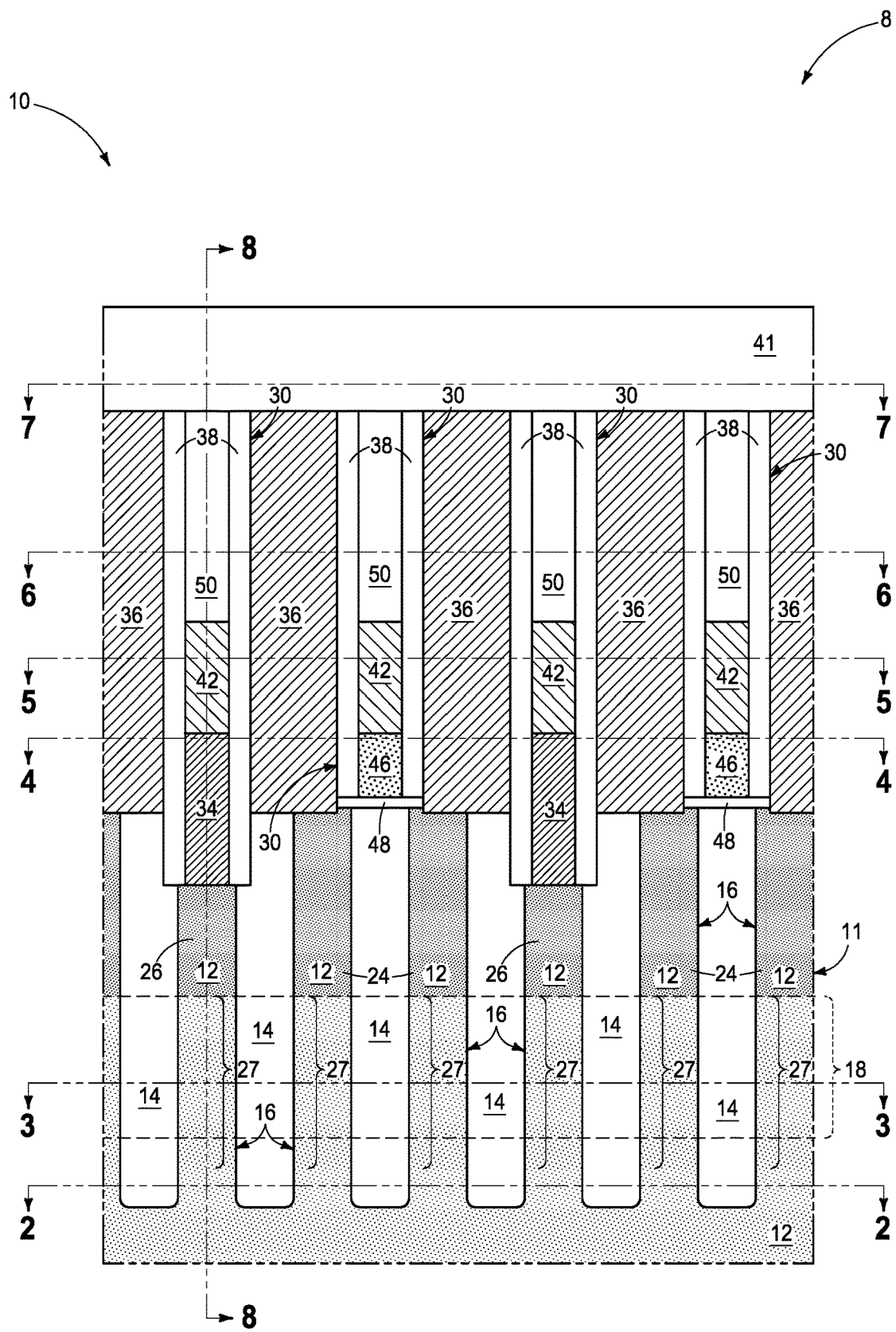
FIG. 1 is a diagrammatic cross-sectional view of a portion of a DRAM construction in process in accordance with some embodiments of the invention and is taken through line 1-1 in FIGS. 1-9.
Figure 2:
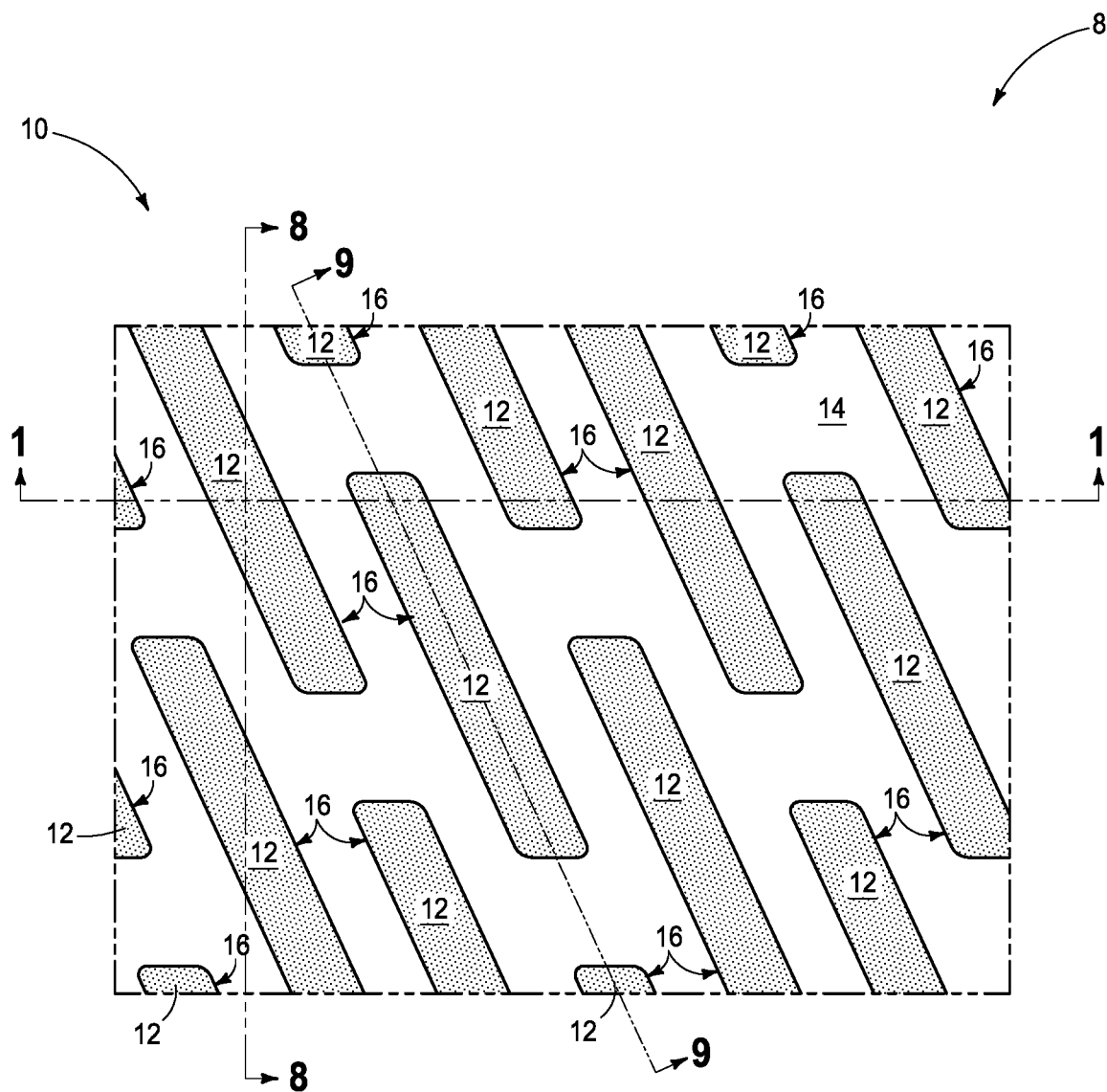
FIG. 2 is a view taken through line 2-2 in FIGS. 1, 8, and 9.
Figure 3:
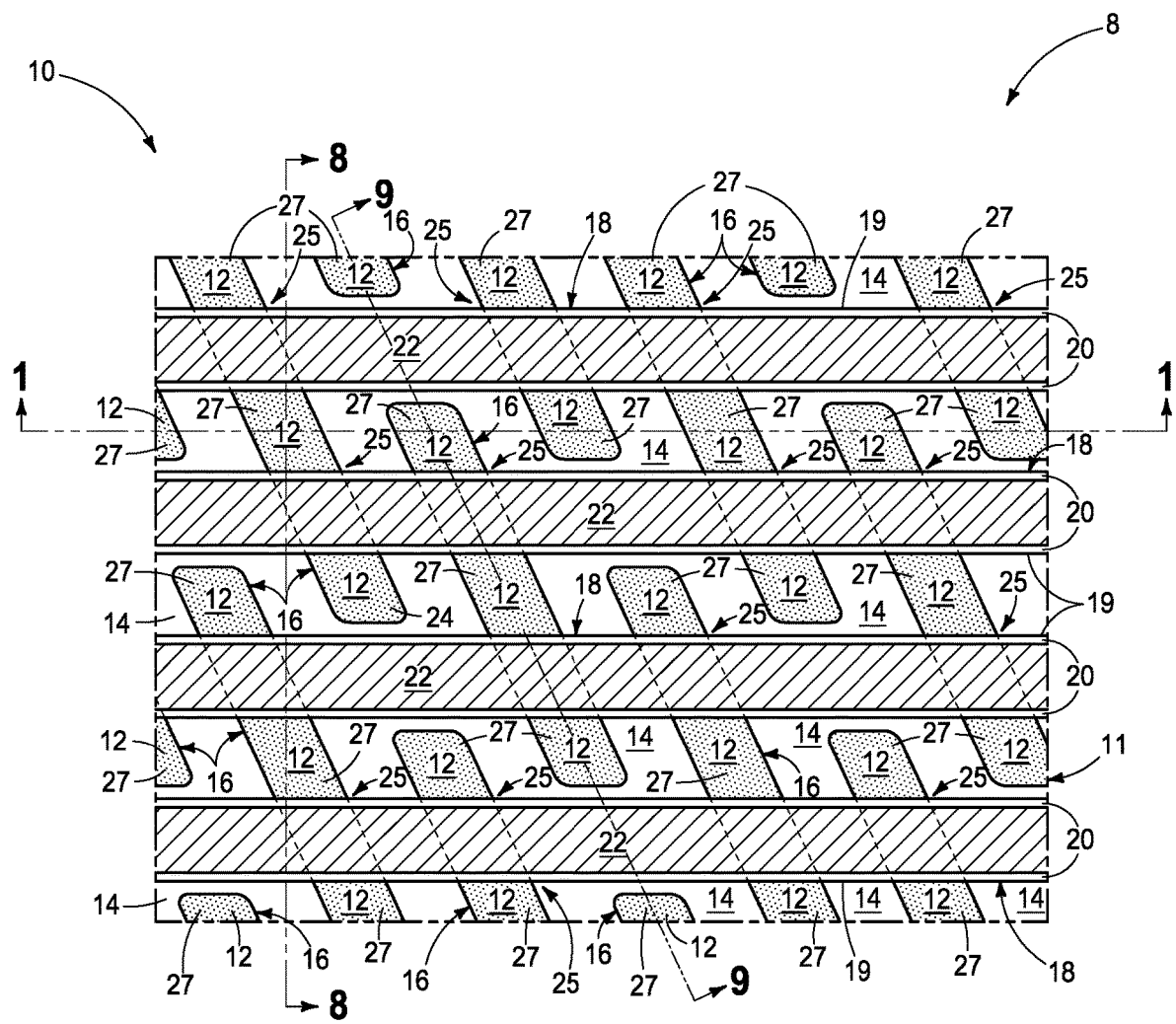
FIG. 3 is a view taken through line 3-3 in FIGS. 1, 8, and 9.
Figure 4:
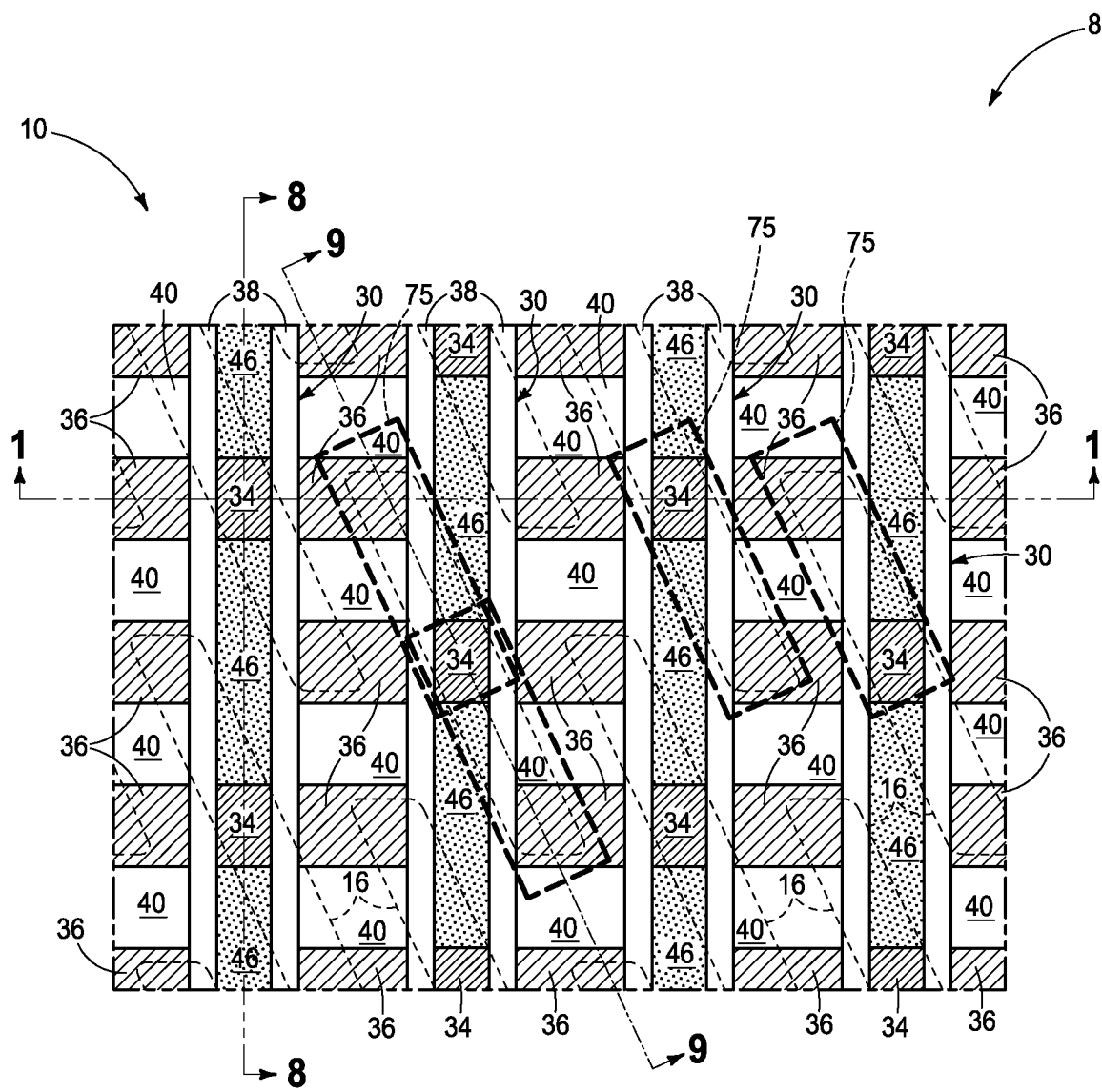
FIG. 4 is a view taken through line 4-4 in FIGS. 1, 8, and 9.
Figure 5:
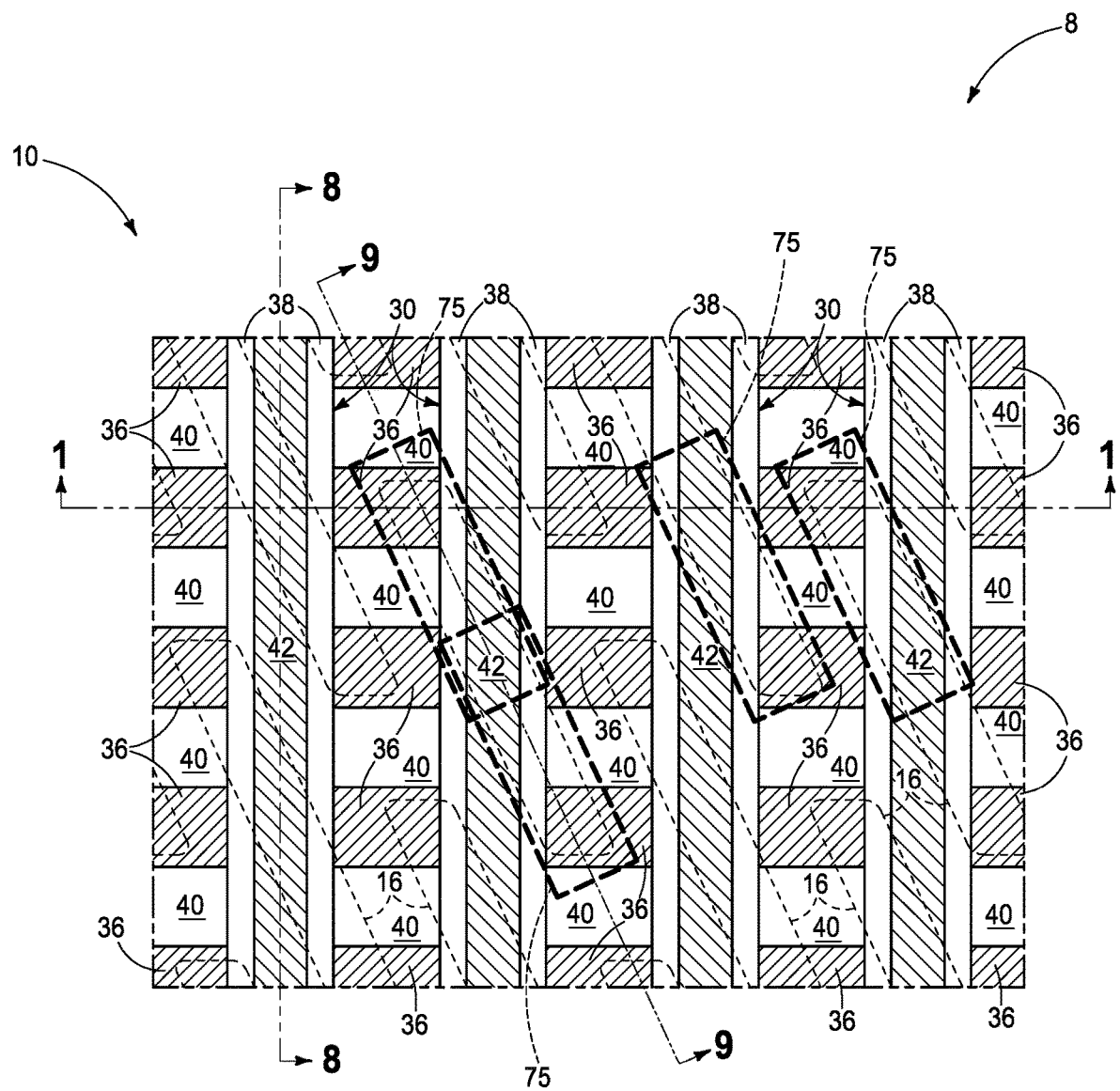
FIG. 5 is a view taken through line 5-5 in FIGS. 1, 8, and 9.

Embodiments of the invention encompass methods of forming an elevationally-elongated conductive structure of integrated circuitry, methods of forming an array of capacitors, and methods of forming DRAM circuitry. First example embodiments or forming DRAM circuitry are described with reference to FIGS. 1-9 showing an example fragment of a substrate construction 8 comprising an array or array area 10 that has been fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-9-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 will comprise memory cells occupying space within outlines 75 (only two outlines 75 shown in FIG. 9, and only four outlines 75 shown in FIGS. 4 and 5, for clarity in such figures), for example DRAM memory cells, individually comprising a field effect transistor device 25 (FIG. 3) and a charge-storage device (not shown in FIGS. 1-8). However, embodiments of the invention encompass fabricating of other memory cells and other constructions of integrated circuitry independent of whether containing memory cells.

Field effect transistors 25 are in the form of recessed access devices (a type of construction of a field effect transistor), with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 comprises at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

In one embodiment, digitline structures 30 are formed that individually directly electrically couple to the one shared source/drain region 26 of multiple of the individual pairs of devices 25. Elevationally-extending conductive vias 34 (e.g., metal material and/or conductively-doped semiconductive material) are spaced longitudinally along digitline structures 30. Conductive vias 34 individually directly electrically couple digitline structures 30 to individual of shared source/drain regions 26 of the individual pairs of devices 25.

A pair of capacitors (e.g., dashed lines designated as 85 in FIG. 9, but not yet completely fabricated) will individually directly electrically couple to one of the other source/drain regions 24 in the individual pairs of devices 25. Elevationally-extending conductive vias 36 (same or different composition from that of vias 34) have been formed between and laterally between and spaced longitudinally along digitline structures 30. Vias 36 will individually interconnect individual non-shared source/drain regions 24 with individual capacitors 85 as will be described in more detail below, and in one embodiment are elevationally elongated. In one embodiment, conductive vias 36 are chemically homogenous (e.g., and physically homogenous). In another embodiment, conductive vias 36 comprises a lower conductive material (e.g., metal material) and an upper conductive material (e.g., conductively-doped semiconductive material such as conductively-doped polysilicon) that are of different compositions relative one another. In one embodiment, conductive vias 36 predominately comprise (i.e., meaning more than 50% by volume up to and including 100% by volume) polysilicon. Example insulator material 38 and/or 40 (e.g., silicon nitride and/or silicon dioxide) surrounds vias 34, 36.

Figure 6:
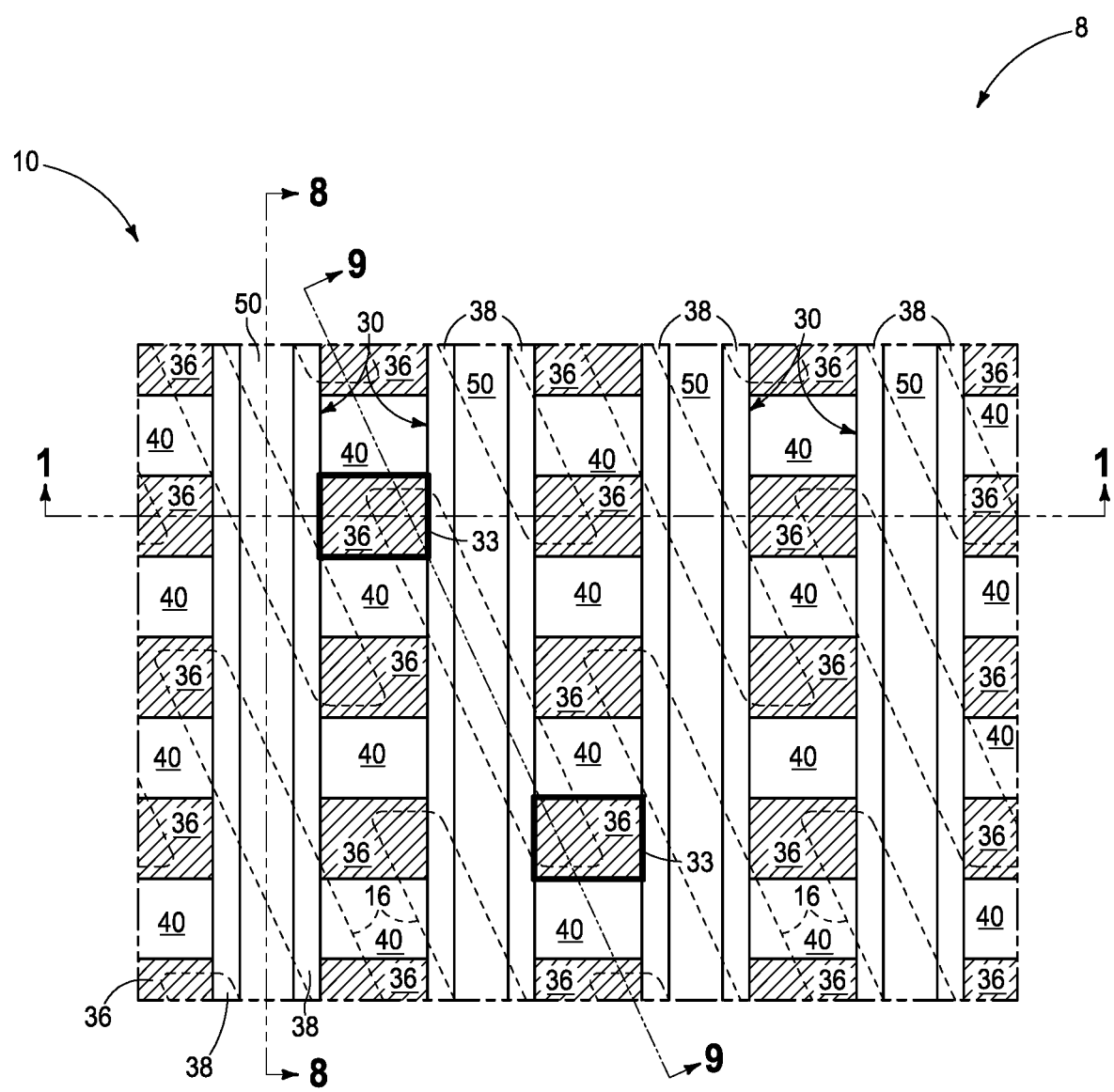
FIG. 6 is a view taken through line 6-6 in FIGS. 1, 8, and 9.
Figure 7:
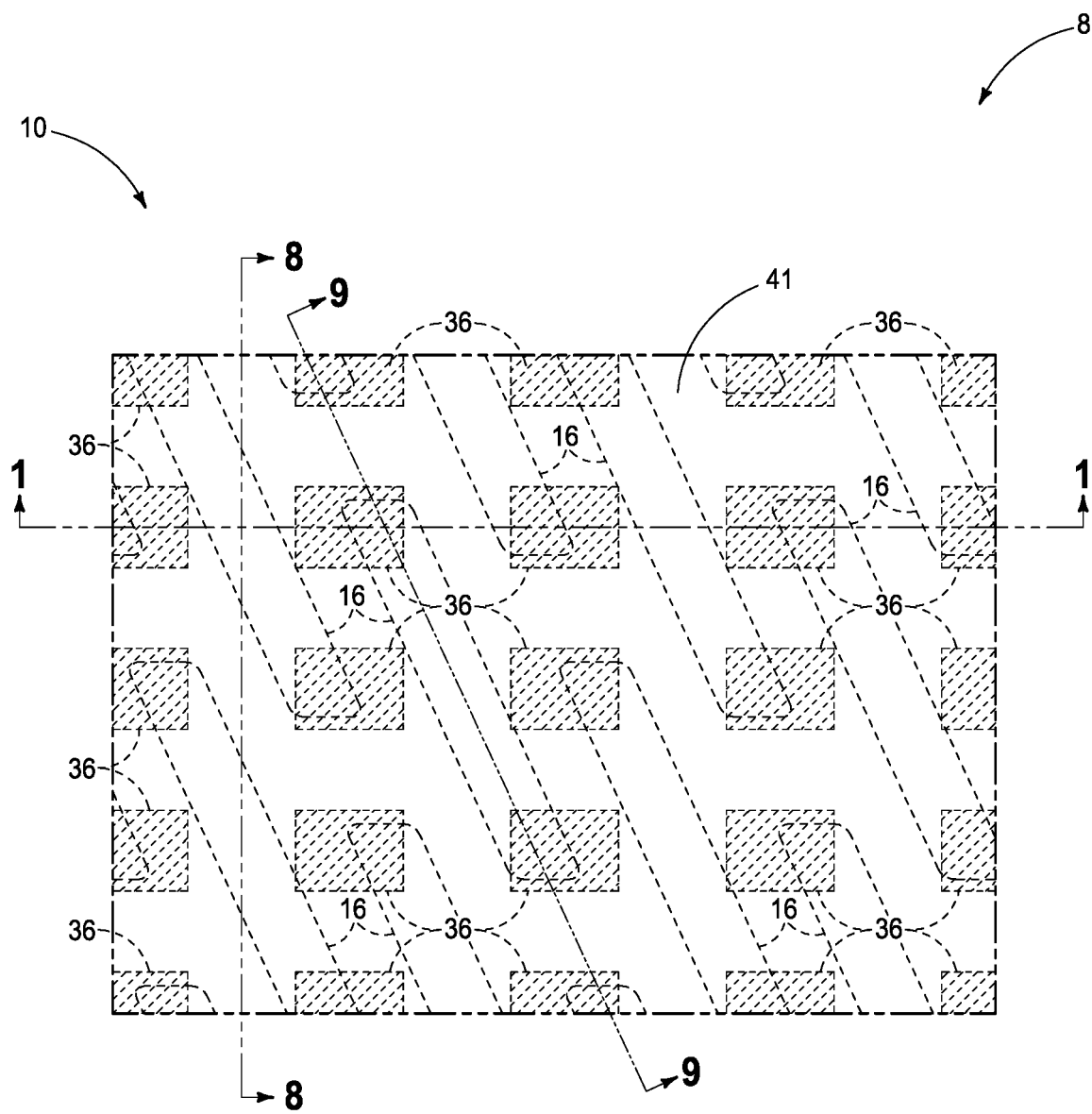
FIG. 7 is a view taken through line 7-7 in FIGS. 1, 8, and 9.
Figure 8:
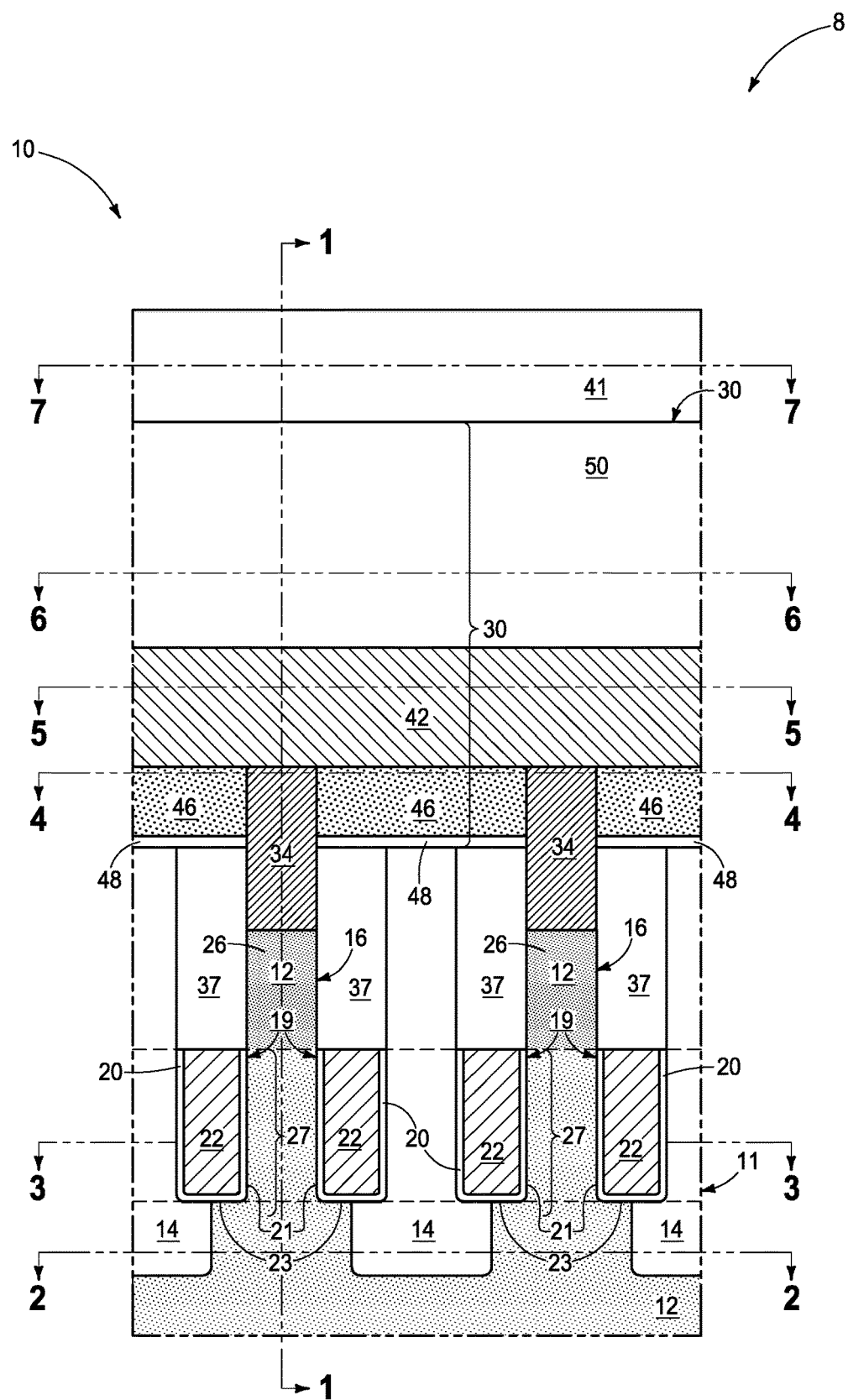
FIG. 8 is a view taken through line 8-8 in FIGS. 1-7.

Individual conductive vias 36 have an upper (i.e., somewhere in the top half of an individual via 36) horizontal perimeter 33 (FIG. 6). Only two such upper horizontal perimeters 33 are designated with a wide black line in FIG. 6 for clarity. Example individual conductive vias 36 as perhaps best perceived by viewing FIGS. 1 and 9 individually have straight-linear and vertical sidewalls. Accordingly, and in one embodiment, individual upper horizontal perimeters 33 may be constant in shape, size, and linear length from their top to their bottom within an individual conductive via 36. Alternately, by way of example only, sidewalls of individual conductive vias 36 may taper radially inward progressing deeper or higher (e.g., to be conical-like, hourglass-like, etc.) in the depicted construction (not shown) whereby horizontal perimeters 33 are not constant in at least one of shape, size, and linear length from their top to their bottom within an individual conductive via 36. Regardless, in one embodiment, upper horizontal perimeters 33 of individual conductive vias 36 are uppermost (i.e., at the very top) horizontal perimeters of the individual conductive vias 36 at least at this point in the process. Example upper horizontal perimeters 33 are shown as being rectangular, although alternate shapes include square, circular, elliptical, oval, triangular, hexagonal, pentagonal, shapes including a combination of curved segment and straight segment sides, etc. Accordingly, upper horizontal perimeters 33 may be of any shape, and further need not be of the same shape relative one another.

A channel region 27 is in semiconductive material 12 below pair of source/drain regions 24, 26 along trench sidewalls 21 and around trench base 23. Channel region 27 may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 9]) within channel region 27 proximate gate insulator 20 such that current is capable of flowing between a pair of source/drain regions 24 and 26 under the access line construction 18 within an individual active area region 16, Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used and constant dopant concentration is not required in any region.

Example digitline structures 30 individually comprise conductive material 42 (same or different composition from that of conductive vias 34 and/or 36) that is directly electrically coupled to conductive vias 34 and extends between immediately-longitudinally-adjacent of conductive vias 34. Digitline structures 30 comprise upper insulator material 50 (e.g., silicon nitride and/or silicon dioxide) above conductive material 42, and insulator material 38. Digitline structures 30 also comprise doped or undoped semiconductor material 46 (example thickness of 25 to 250 Angstroms) between immediately-longitudinally-adjacent conductive vias 34. Digitline structures 30 also comprises a lower insulative material 48 (e.g., one or more of silicon dioxide, silicon nitride, aluminum dioxide, hafnium oxide, etc., of an example thickness of 50 to 200 Angstroms) below semiconductor material 46 between immediately-longitudinally-adjacent conductive vias 34. As alternate examples, material 46 may comprise insulative material or metal material or be eliminated with conductive material 42 extending inwardly to lower insulative material 48 (not shown).

Masking material 41 has been formed directly above digitline structures 30 and conductive vias 36. Masking material 41 may comprise any of insulative, conductive, and semiconductive materials, and may or may not remain in the finished integrated circuitry construction. In one embodiment, masking material is insulative (e.g., silicon dioxide and/or silicon nitride) and at least a majority (i.e., more than 50% up to and including 100% by volume) thereof remains in a finished integrated circuitry construction. In one embodiment, at least a majority of the masking material is not insulative (i.e., it is semiconductively-doped semiconductor material and/or conductive [e.g., metal material and/or conductively-doped semiconductor material]). In one embodiment, at least a majority of masking material 41 is ultimately removed, and in one such embodiment all of masking material 41 is ultimately removed (neither being shown and which would likely ultimately be replaced by insulator material).

Figure 10:
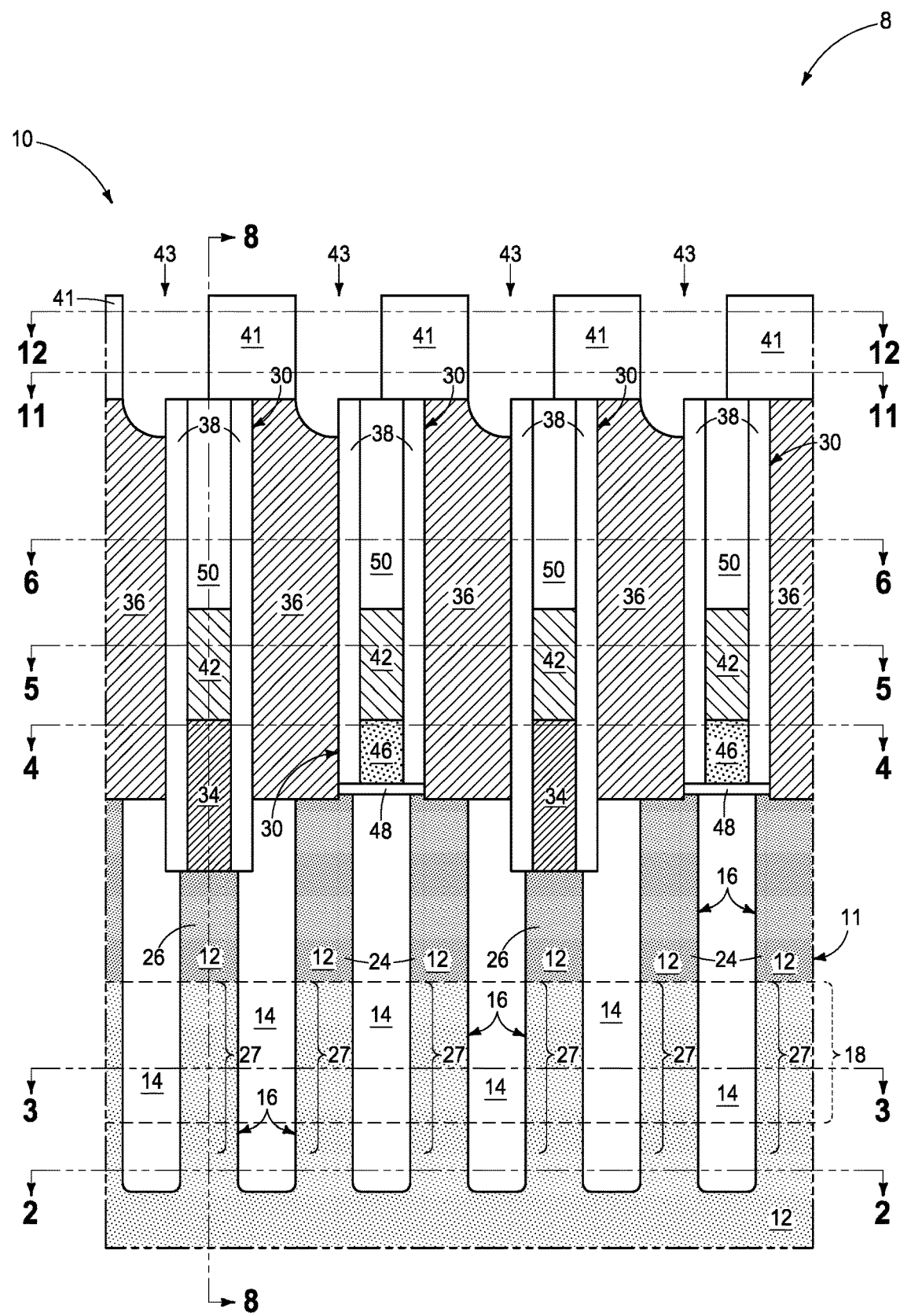
FIG. 10 is a view of the FIG. 1 substrate at a processing step subsequent to that shown by FIG. 1 and is taken through line 10-10 in FIGS. 11 and 12.
Figure 11:
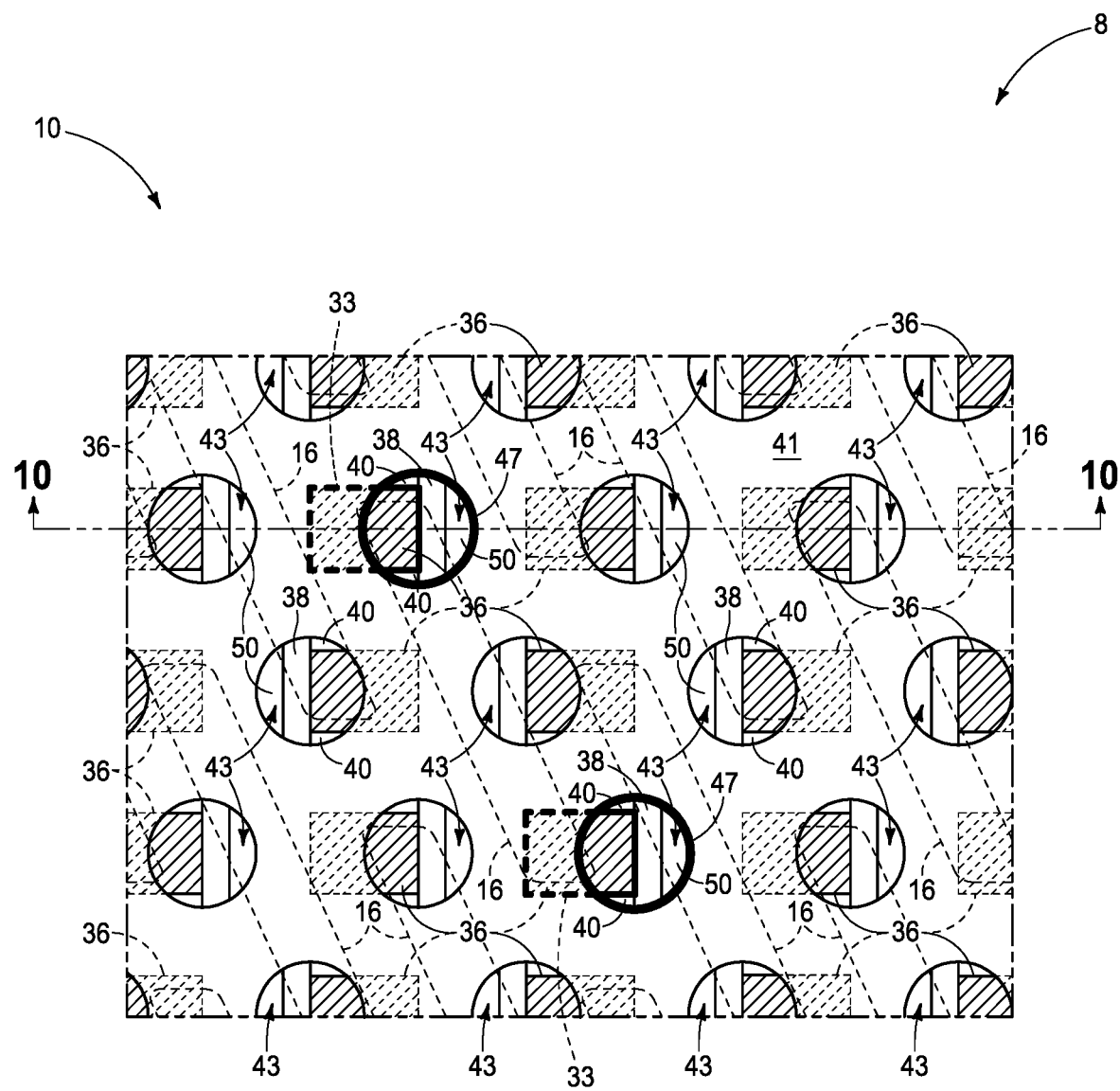
FIG. 11 is a view taken through line 11-11 in FIG. 10.
Figure 12:
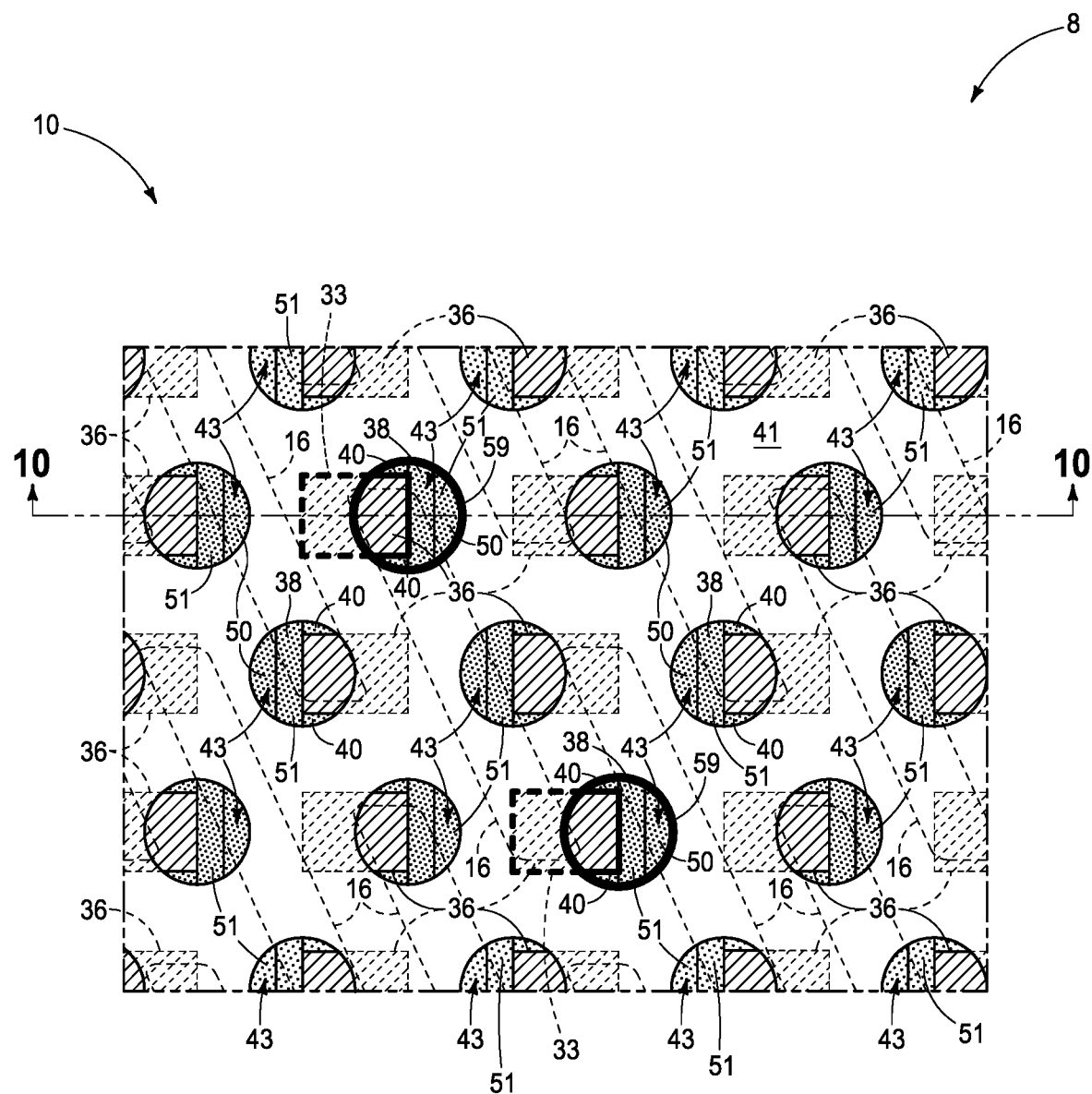
FIG. 12 is a view taken through line 12-12 in FIG. 10.

Referring to FIGS. 10-12, an opening 43 has been formed (e.g., by photolithography and etch with or without pitch multiplication) in masking material 41 directly above individual upper horizontal perimeters 33 of individual conductive vias 36. Individual masking-material openings 43 comprise a lower (i.e., somewhere in the bottom half of an individual opening 43) horizontal perimeter 47 (FIG. 11) that overlaps (i.e., laterally and/or transversely) the upper horizontal perimeter 33 of the conductive via 36 directly there-below. Only two such lower horizontal perimeters 47 are designated with a wide black line in FIG. 11 for clarity. Example openings 43 as perhaps best perceived by viewing FIG. 10 individually have straight-linear and vertical sidewalls. Accordingly, and in one embodiment, individual lower horizontal perimeters 47 may be constant in shape, size, and linear length from top to bottom within an individual opening 43. Alternately, by way of example, sidewalls of individual openings 43 may taper radially inward progressing deeper or higher (e.g., to be conical-like, hourglass-like, etc.) in the depicted construction (not shown) whereby lower horizontal perimeters 47 are not constant in at least one of shape, size, and linear length from their top to their bottom. Regardless, in one embodiment, lower horizontal perimeters 47 of individual openings 43 are lowermost at the very bottom) horizontal perimeters of the individual openings 43 at least at this point in the process. Example lower horizontal perimeters 47 are shown as being circular, although alternate example shapes include elliptical, oval, square, rectangular, triangular, hexagonal, pentagonal, shapes including a combination of curved segment and straight segment sides, etc. Accordingly, lower horizontal perimeters 47 may be of any shape, and further need not be of the same shape relative one another.

Individual masking-material openings 43 comprise an upper horizontal perimeter 59 (FIG. 12) having at least some portion (e.g., 51) that is outward (i.e., laterally and/or transversely) of the upper horizontal perimeter 33 of the conductive via 36 directly there-below. Only two such upper horizontal perimeters 59 are designated with a wide black outline in FIG. 12 with respect to two masking-material openings 43 for clarity. Example portions 51 are diagrammatically shown with dense stippling in FIG. 12 within the other than the two masking-material openings 43 showing horizontal perimeters 33 and 59.

Figure 13:
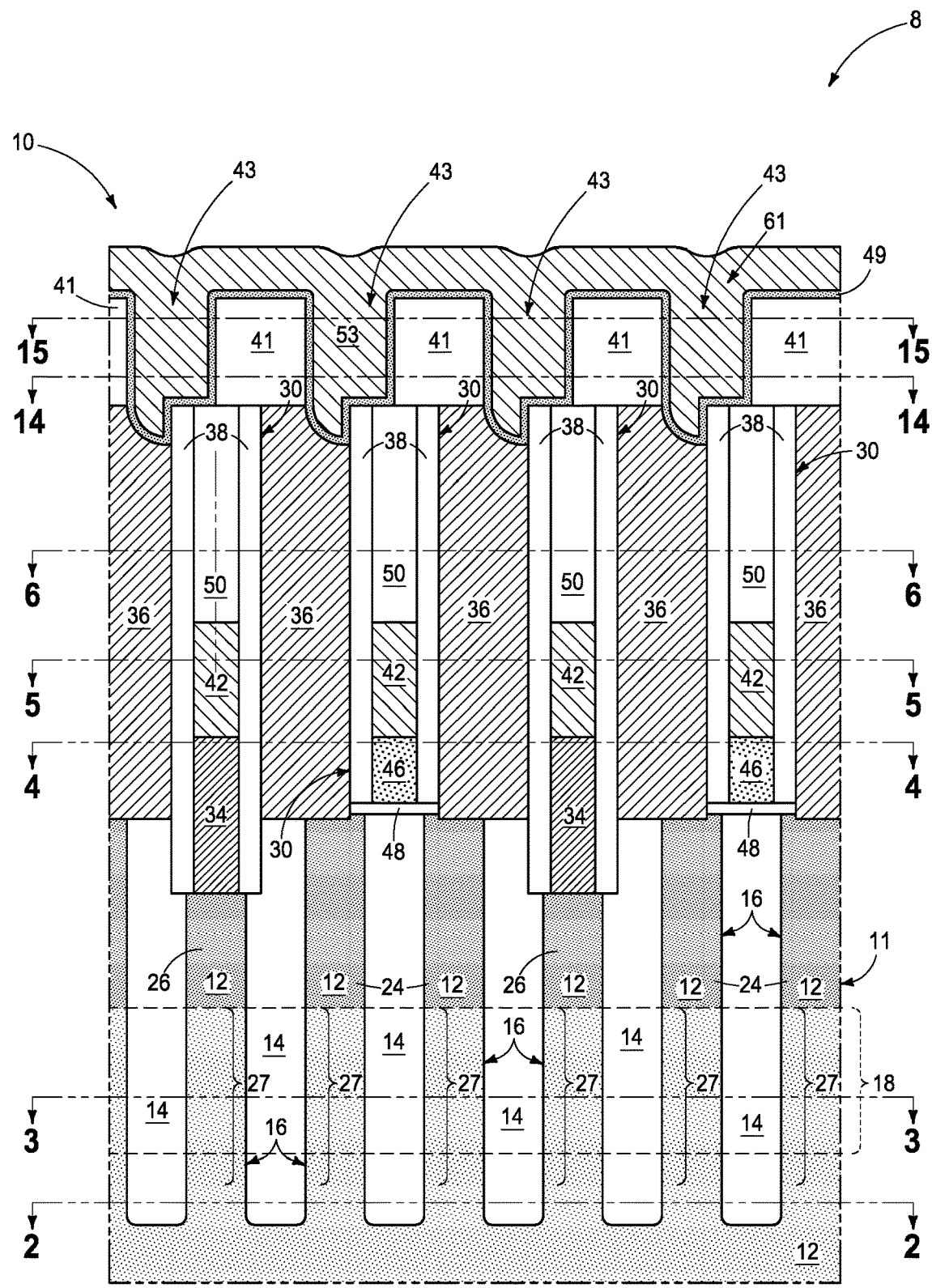
FIG. 13 is a view of the FIG. 10 substrate at a processing step subsequent to that shown by FIG. 10 and is taken through line 13-13 in FIGS. 14 and 15.
Figure 14:
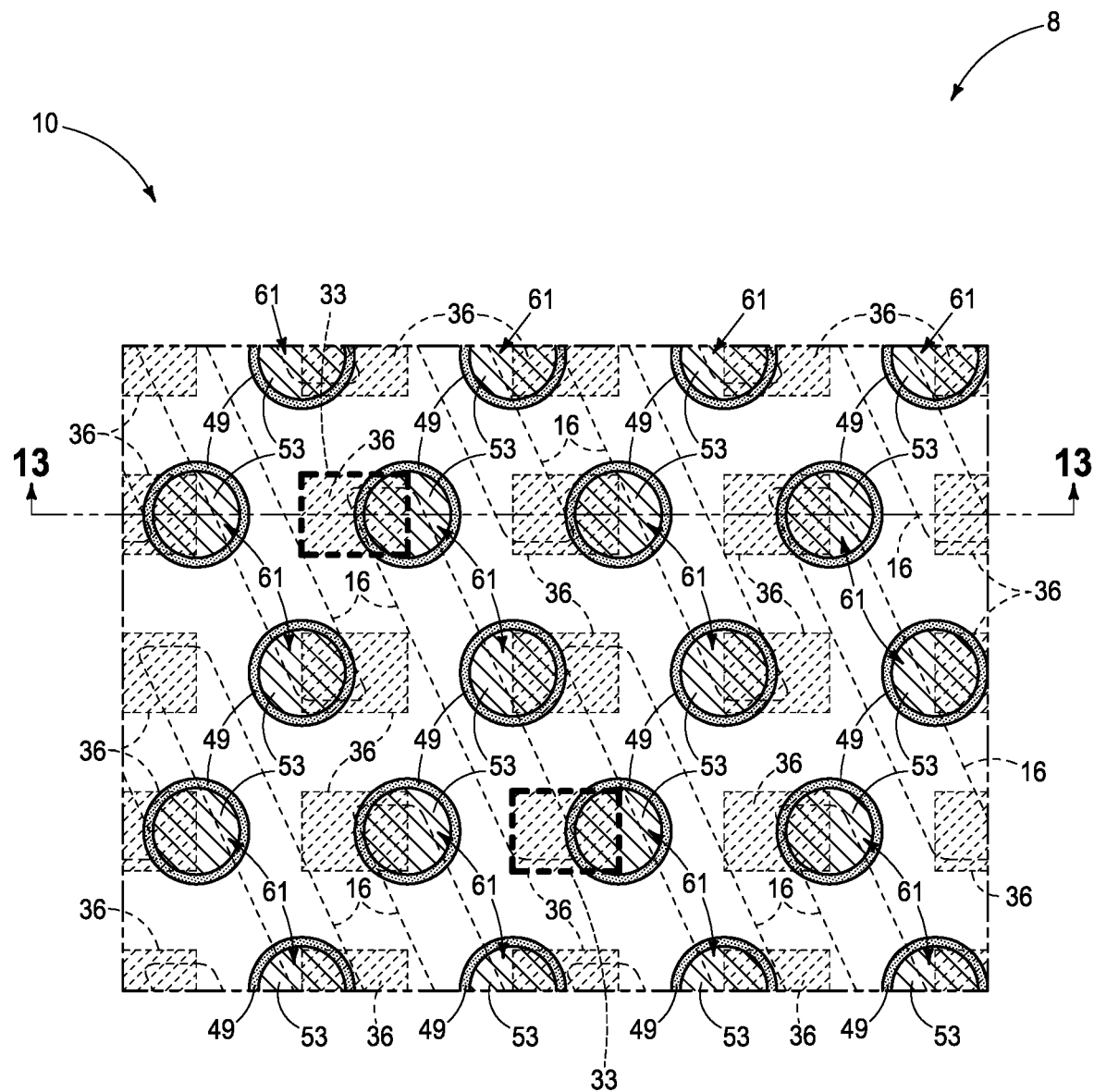
FIG. 14 is a view taken through line 14-14 in FIG. 13.
Figure 15:
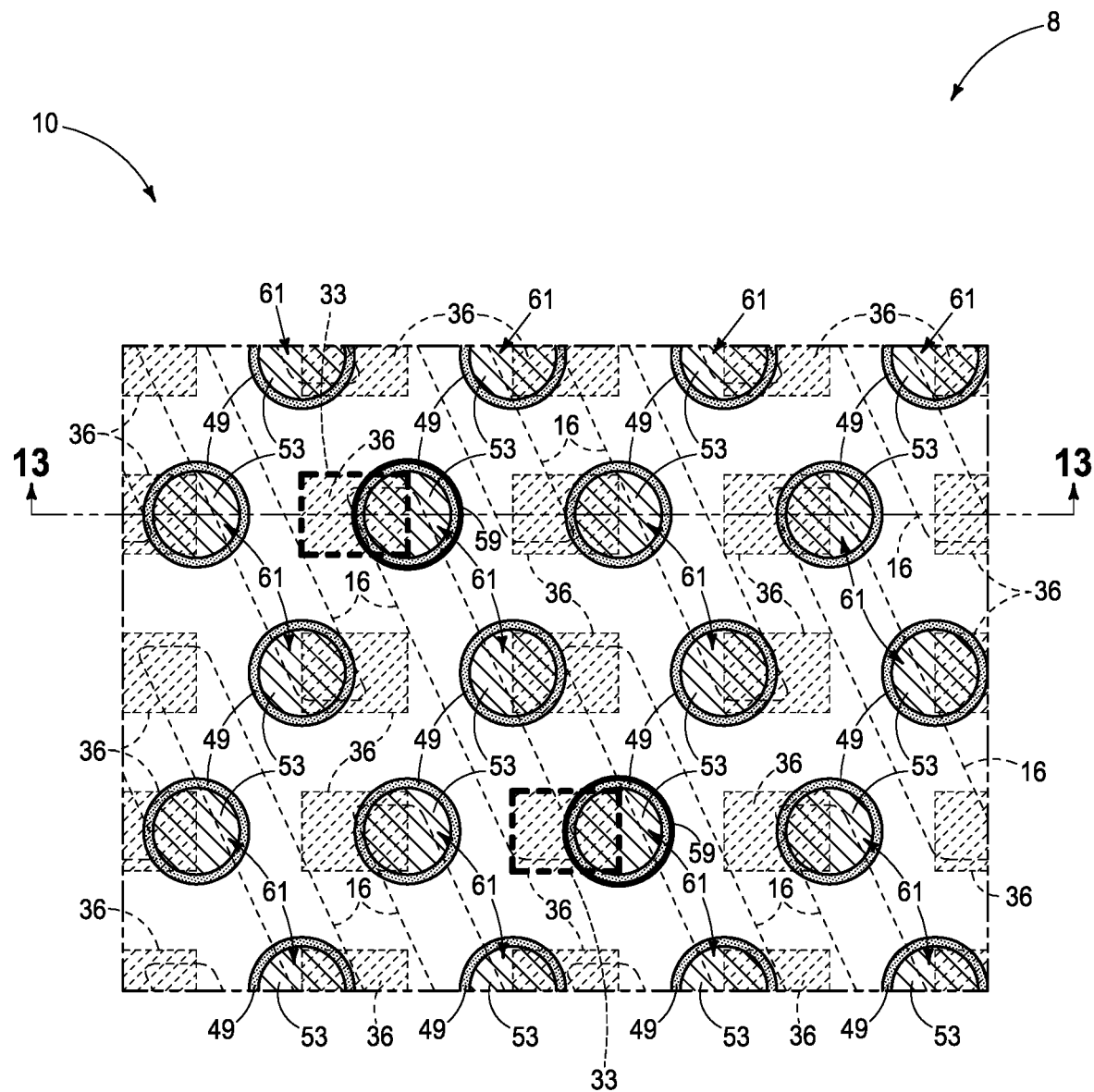
FIG. 15 is a view taken through line 15-15 in FIG. 13.

Referring to FIGS. 13-15, conductive material 61 has been formed in individual masking-material openings 43 against sidewalls thereof and directly against the conductive via 36 directly there-below. In one embodiment and as shown, conductive material 61 in individual masking-material openings 43 comprises a base and peripheral (i.e., of individual openings 43) lining 49 of one composition (e.g., TiN) and a radially-inner core 53 of another composition (e.g., elemental-form tungsten) different from the one composition. Regardless, conductive material 61 has an upper (i.e., somewhere in the top half of an individual mass of conductive material 61) horizontal perimeter (e.g., 59 in FIG. 15) in the individual masking-material openings 43 that extends outwardly beyond (i.e., laterally and/or transversally) the upper perimeter 33 of the conductive via 36 directly there-below. In one embodiment, individual upper horizontal perimeters 59 of conductive material 61 in individual masking-material openings 43 are uppermost horizontal perimeters of conductive material 61 in individual masking-material openings 43.

In one embodiment, conductive vias 36 and conductive material 61 comprise conductive material of the same composition. In another embodiment, conductive vias 36 and conductive material 61 comprise at least two conductive materials of different compositions relative one another and, in one such embodiment, the conductive vias and the conductive material do not comprise any conductive material of the same composition relative one another. Regardless, in one embodiment, conductive material 61 predominately comprises metal material.

In one embodiment, individual of upper horizontal perimeters 59 of conductive material 61 in individual masking-material openings 43 are of different shape from that of the upper horizontal perimeter 33 of the conductive via 36 directly there-below. In one embodiment, individual upper horizontal perimeters 59 of conductive material 61 in individual masking-material openings 43 are of different length from that of the upper horizontal perimeter 33 of the conductive via 36 directly there-below. In one such embodiment, such are both of different length and of different shape relative one another.

Figure 16:
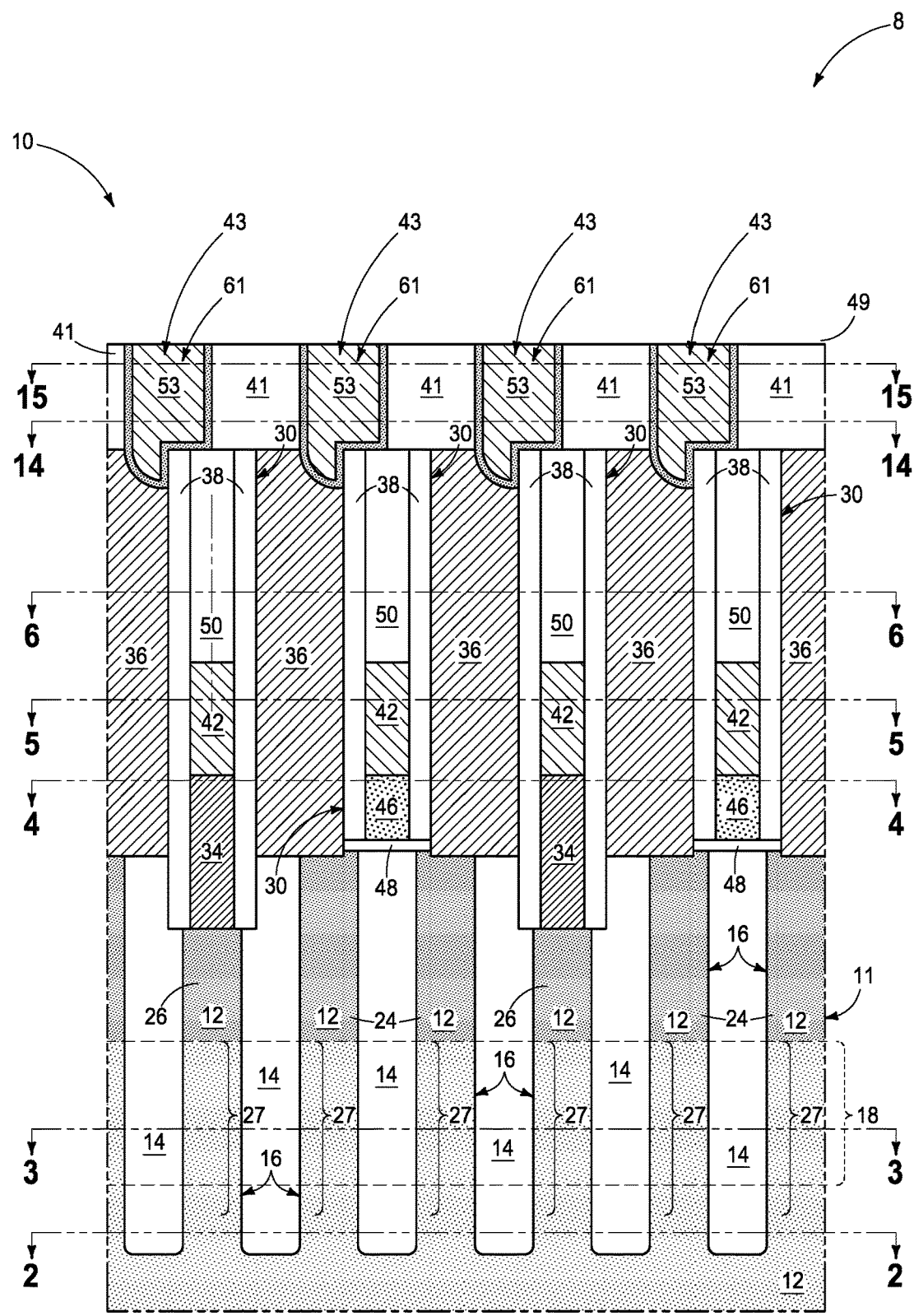
FIG. 16 is a view of the FIG. 13 substrate at a processing step subsequent to that shown by FIG. 13.

In one embodiment and as shown, conductive material 61 has been deposited both into individual masking-material openings 43 and atop masking material 41 outside of masking-material openings 43. FIG. 16 shows example subsequent processing whereby conductive material 61 has been planarized back at least to an elevationally-outermost surface of masking material 41.

Figure 9:
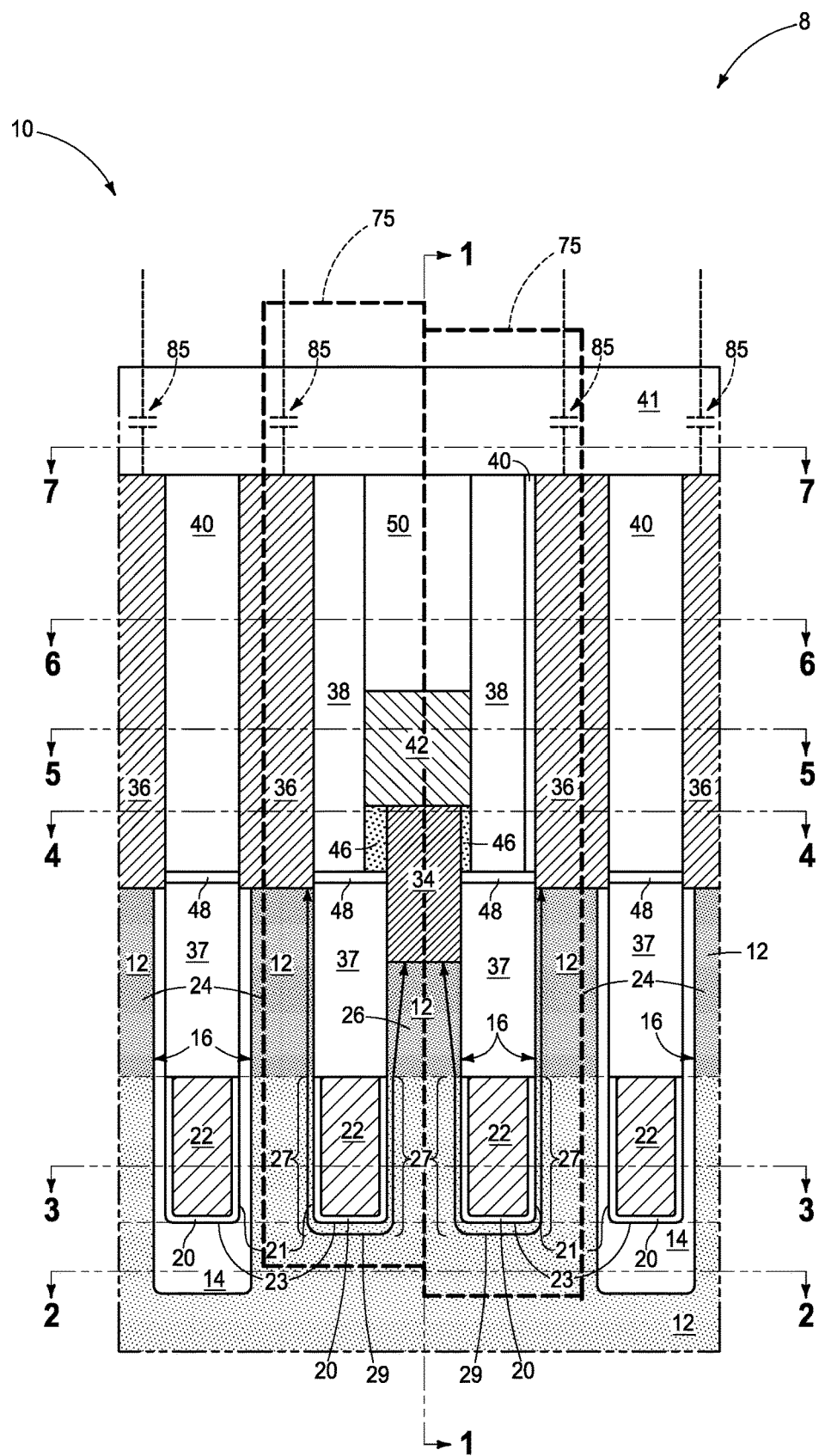
FIG. 9 is a view taken through line 9-9 in FIGS. 2-7.
Figure 17:
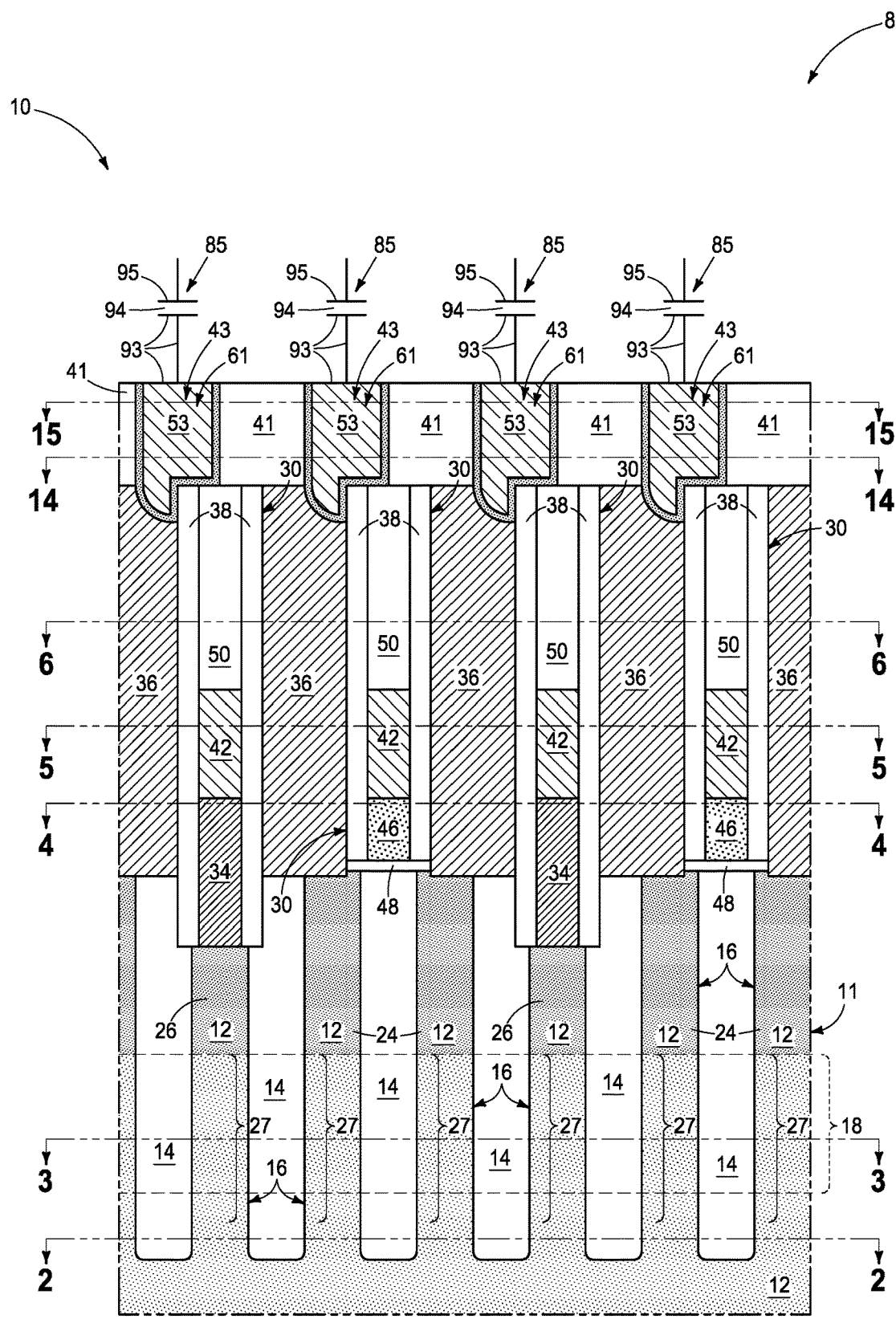
FIG. 17 is a view of the FIG. 16 substrate at a processing step subsequent to that shown by FIG. 16.

Referring to FIG. 17, a plurality of capacitors 85 has been formed which are largely schematically shown in FIG. 17 (and in FIG. 9). Capacitors 85 individually comprise a lower conductive electrode 93, an upper conductive electrode 95, and a capacitor insulator 94 there-between. Individual lower electrodes 93 comprise conductive material 61 in individual masking-material openings 43, Conductive material 61 in some embodiments may be considered as a redistribution layer (RDL) (i.e., an upper layer of integrated circuitry that comprises metal material and that makes input/output nodes for the integrated circuitry available in or at other locations). Forming RDL material as described above may reduce tendency of undesired shorting of immediately laterally and/or transversally-spaced masses of RDL material as occurs in prior processes.

Embodiments of the invention encompass a method of forming an array (e.g., 10) of capacitors (e.g., 85) independent of whether forming DRAM or other memory circuitry. Such a method comprises providing a substrate (e.g., 8) comprising an array of horizontally-elongated and laterally-spaced conductive-line structures (e.g., 30). Conductive vias (e.g., 36) are laterally between and spaced longitudinally along immediately-laterally-adjacent of the conductive-line structures. The conductive vias individually have an upper horizontal perimeter (e.g., 33). Masking material (e.g., 41) is formed directly above the conductive-line structures and the conductive vias. An opening (e.g., 43) is formed in the masking material directly above individual of the upper horizontal perimeters of individual of the conductive vias. Individual of the masking-material openings comprise a lower horizontal perimeter (e.g., 47) that overlaps the upper horizontal perimeter of the conductive via directly there-below. The individual masking-material openings comprise an upper horizontal perimeter (e.g., 59) having at least some portion (e.g., 51) that is outward of the upper horizontal perimeter of the conductive via directly there-below. Conductive material (e.g., 61) is formed in the individual masking-material openings against sidewalls of the individual masking-material openings and directly against the conductive via directly there-below. An upper horizontal perimeter (e.g., 59) of the conductive material in the individual masking-material openings extends outwardly beyond the upper horizontal perimeter of the conductive via directly there-below.

A plurality of capacitors is formed that individually comprise a lower conductive electrode (e.g., 93), an upper conductive electrode (e.g., 95), and a capacitor insulator (e.g., 94) there-between. Individual of the lower conductive electrodes comprise the conductive material in the individual masking-material openings.

Any other attribute(s) or aspect(s) as shown and/or described herein with respect to other embodiments may be used.

Embodiments of the invention encompass a method of forming elevationally-elongated conductive structures (e.g., a combination of materials 36 and 61, and in one embodiment which are vertical or within 10° of vertical) of integrated circuitry regardless of whether comprising memory or other circuitry. Such a method comprises providing a substrate (e.g., 8) comprising a plurality of spaced elevationally-extending conductive vias (e.g., 36) individually having an upper horizontal perimeter (e.g., 33), Masking material (e.g., 41) is formed directly above the conductive vias. An opening (e.g., 43) in the masking material is formed directly above individual of the upper horizontal perimeters of individual of the conductive vias. Individual of the masking-material openings comprise a lower horizontal perimeter (e.g., 47) that overlaps the upper horizontal perimeter of the conductive via directly there-below. Individual of the masking-material openings comprise an upper horizontal perimeter (e.g., 59) that overlaps the upper horizontal perimeter of the conductive via directly there-below.

Conductive material (e.g., 61) is formed in the individual masking-material openings against sidewalls of the individual masking-material openings and directly against the conductive via directly there-below. An upper horizontal perimeter (e.g., 59) of the conductive material in the individual masking-material openings extends outwardly beyond the upper the horizontal perimeter of the conductive via directly there-below.

In one embodiment, the substrate comprises a pair of horizontally-elongated and laterally-spaced conductive-line structures, with the plurality of spaced elevationally-extending conductive vias being laterally between and spaced longitudinally along the conductive-line structures.

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral or transverse overlap (i.e., horizontally) of two stated regions/materials/components relative one another. Also, use of "above" not preceded by "directly" only requires that some portion of the stated region/material/component that is above the other be devotionally outward of the other (i.e., independent of whether there is any lateral or transverse overlap of the two stated regions/materials/components). Analogously, use of "under" not preceded by "directly" only requires that some portion of the stated region/material/component that is under the other be elevationally inward of the other (i.e., independent of whether there is any lateral or transverse overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another in contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Conclusion

In some embodiments, a method of forming an array of capacitors comprises providing a substrate comprising an array of horizontally-elongated and laterally-spaced conductive-line structures. Conductive vias are laterally between and spaced longitudinally along immediately-laterally-adjacent of the conductive-line structures. The conductive vias individually have an upper horizontal perimeter. Masking material is directly above the conductive-line structures and the conductive vias. An opening is formed in the masking material directly above individual of the upper horizontal perimeters of individual of the conductive vias. Individual of the masking-material openings comprise a lower horizontal perimeter that overlaps the upper horizontal perimeter of the conductive via directly there-below. The individual masking-material openings comprise an upper horizontal perimeter having at least some portion that is outward of the upper horizontal perimeter of the conductive via directly there-below. Conductive material is formed in the individual masking-material openings against sidewalk of the individual masking-material openings and directly against the conductive via directly there-below. An upper horizontal perimeter of the conductive material in the individual masking-material openings extends outwardly beyond the upper horizontal perimeter of the conductive via directly there-below. A plurality of capacitors is formed that individually comprise a lower conductive electrode, an upper conductive electrode, and a capacitor insulator there-between. Individual of the lower conductive electrodes comprise the conductive material in the individual masking-material openings.

In some embodiments, a method of forming DRAM circuitry comprises providing a substrate comprising pairs of recessed access devices. The recessed access devices individually comprise a conductive gate in a trench in semiconductive material. A gate insulator is along sidewalls and a base of the trench between the conductive gate and the semiconductive material. A pair of source/drain regions is in upper portions of the semiconductive material on opposing sides of the trench. A channel region is in the semiconductive material below the pair of source/drain regions along the trench sidewalls and around the trench base. One of the source/drain regions of the pair of source/drain regions in individual of the pairs of recessed access devices is laterally between the conductive gates in and is shared by the individual pairs of recessed access devices. The others of the source/drain regions of the pair of source/drain regions are not shared in the individual pairs of recessed access devices. Digitline structures are formed that are individually directly electrically coupled to the one shared source/drain region of multiple of the individual pairs of recessed access devices. Conductive vias are formed laterally between and spaced longitudinally along the digitline structures. Individual of the conductive vias are directly electrically coupled to one of the other source/drain regions in the individual pairs of recessed access devices. The individual conductive vias have an upper horizontal perimeter. Masking material is formed directly above the digitline structures and the conductive vias. An opening is formed in the masking material directly above individual of the upper horizontal perimeters of individual of the conductive vias. Individual of the masking-material openings comprise a lower horizontal perimeter that overlaps the upper horizontal perimeter of the conductive via directly there-below. The individual masking-material openings comprise an upper horizontal perimeter having at least some portion that is outward of the upper horizontal perimeter of the conductive via directly there-below. Conductive material is formed in the individual masking-material openings against sidewalls of the individual masking-material openings and directly against the conductive via directly there-below. An upper horizontal perimeter of the conductive material in the individual masking-material openings extends outwardly beyond the upper horizontal perimeter of the conductive via directly there-below. A plurality of capacitors is formed and that individually comprise a lower conductive electrode, an upper conductive electrode, and a capacitor insulator there-between. Individual of the lower conductive electrodes comprise the conductive material in the individual masking-material openings.

In some embodiments, a method of forming elevationally-elongated conductive structures of integrated circuitry comprises providing a substrate comprising a plurality of spaced elevationally-extending conductive vias individually having an upper horizontal perimeter. The conductive vias individually have an upper horizontal perimeter. Masking material is formed directly above the conductive vias. An opening is formed in the masking material directly above individual of the upper horizontal perimeters of individual of the conductive vias. Individual of the masking-material openings comprise a lower horizontal perimeter that overlaps the upper horizontal perimeter of the conductive via directly there-below. Individual of the masking-material openings comprise a lower horizontal perimeter that overlaps the upper horizontal perimeter of the conductive via directly there-below. Conductive material is formed in the individual masking-material openings against sidewalls of the individual masking-material openings and directly against the conductive via directly there-below. An upper horizontal perimeter of the conductive material in the individual masking-material openings extends outwardly beyond the upper horizontal perimeter of the conductive via directly there-below.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming elevationally-elongated conductive structures of integrated circuitry, comprising:
providing a substrate comprising a plurality of spaced elevationally-extending conductive vias individually having an upper horizontal perimeter, the upper horizontal perimeter of individual of the conductive vias having a pair of opposing via sidewalls in a vertical cross-section;
forming masking material directly above the conductive vias;
forming an opening in the masking material directly above individual of the upper horizontal perimeters of the individual conductive vias, individual of the masking-material openings comprising a lower horizontal perimeter that overlaps the upper horizontal perimeter of the conductive via directly there-below, individual of the masking-material openings comprising an upper horizontal perimeter that overlaps the upper horizontal perimeter of the conductive via directly there-below, the upper horizontal perimeter of the individual masking-material openings having a pair of opposing opening sidewalls in the vertical cross-section, one of the pair of opening sidewalls being laterally between the pair of via sidewalls in the vertical cross-section, another of the pair of opening sidewalls being laterally outward of the pair of via sidewalls in the vertical cross-section;
forming conductive material in the individual masking-material openings directly against the pair of opening sidewalls and directly against the conductive via directly there-below, an upper horizontal perimeter of the conductive material in the individual masking-material openings extending outwardly beyond the upper horizontal perimeter of the conductive via directly there-below; and
the substrate comprising a pair of horizontally-elongated and laterally-spaced conductive-line structures, the plurality of spaced elevationally-extending conductive vias being laterally between and spaced longitudinally along the conductive-line structures.

2. The method of claim 1 wherein the masking material is insulative and at least a majority thereof remains in a finished integrated circuitry construction.

3. The method of claim 1 wherein at least a majority of the masking material is not insulative.

4. The method of claim 1 wherein at least a majority of the masking material is ultimately removed.

5. The method of claim 4 wherein all of the masking material is ultimately removed.

6. The method of claim 1 wherein forming the masking-material openings comprises etching that forms the masking-material openings to extend into and remove some conductor material from atop the conductive vias.

7. The method of claim 6 wherein that portion of the masking-material openings that extends into the conductive vias has a pair of opposing extended sidewalls in the vertical cross-section, one of the pair of extended sidewalls being straight in the vertical cross-section, another of the pair of extended sidewalls being curved in the vertical cross-section.

8. The method of claim 7 wherein the straight sidewall is vertical.

9. The method of claim 7 wherein the curved sidewall comprises the conductor material of the via, the straight sidewall comprising insulator material.

10. A method of forming elevationally-elongated conductive structures of integrated circuitry, comprising:
    providing a substrate comprising a plurality of spaced elevationally-extending conductive vias individually having an upper horizontal perimeter, the upper horizontal perimeter of individual of the conductive vias having a pair of opposing via sidewalls in a vertical cross-section;
    forming masking material directly above the conductive vias;
    forming an opening in the masking material directly above individual of the upper horizontal perimeters of the individual conductive vias, individual of the masking-material openings comprising a lower horizontal perimeter that overlaps the upper horizontal perimeter of the conductive via directly there-below, individual of the masking-material openings comprising an upper horizontal perimeter that overlaps the upper horizontal perimeter of the conductive via directly there-below, the upper horizontal perimeter of the individual masking-material openings having a pair of opposing opening sidewalls in the vertical cross-section, one of the pair of opening sidewalls being laterally between the pair of via sidewalls in the vertical cross-section, another of the pair of opening sidewalls being laterally outward of the pair of via sidewalls in the vertical cross-section;
    forming conductive material in the individual masking-material openings directly against the pair of opening sidewalls and directly against the conductive via directly there-below, an upper horizontal perimeter of the conductive material in the individual masking-material openings extending outwardly beyond the upper horizontal perimeter of the conductive via directly there-below; and
    forming a plurality of capacitors individually comprising a lower conductive electrode, an upper conductive electrode, and a capacitor insulator there-between; individual of the lower conductive electrodes comprising the conductive material in the individual masking-material openings.

11. The method of claim 10 wherein the masking material is insulative and at least a majority thereof remains in a finished integrated circuitry construction.

12. The method of claim 10 wherein forming the masking-material openings comprises etching that forms the masking-material openings to extend into and remove some conductor material from atop the conductive vias.

13. The method of claim 12 wherein that portion of the masking-material openings that extends into the conductive vias has a pair of opposing extended sidewalls in the vertical cross-section, one of the pair of extended sidewalls being straight in the vertical cross-section, another of the pair of extended sidewalls being curved in the vertical cross-section.

14. The method of claim 13 wherein the straight sidewall is vertical.

15. The method of claim 13 wherein the curved sidewall comprises the conductor material of the via, the straight sidewall comprising insulator material.

* * * * *